United States Patent [19]

Sawada et al.

[11] 4,058,804
[45] Nov. 15, 1977

[54] SIGNAL MONITORING SYSTEM

[75] Inventors: Fred H. Sawada, Scotia; Frank M. Klementowski, Saratoga Springs; James S. Bishop, Schenectady, all of N.Y.

[73] Assignee: General Electric Company, Schenectady, N.Y.

[21] Appl. No.: 666,150

[22] Filed: Mar. 11, 1976

[51] Int. Cl.$^2$ .............................................. G08B 21/00
[52] U.S. Cl. ................................ 340/248 A; 325/478; 340/248 P
[58] Field of Search ............... 340/248 R, 248 A, 267, 340/248 P; 325/478, 348; 328/164, 165; 310/248, 68 B; 307/153

[56] References Cited

U.S. PATENT DOCUMENTS

| 3,588,705 | 6/1971 | Paine | 325/478 X |
| 3,653,019 | 3/1972 | Barton et al. | 325/478 X |

Primary Examiner—John W. Caldwell, Sr.
Assistant Examiner—Daniel Myer
Attorney, Agent, or Firm—John F. Ahern; Herbert E. Messenger; James W. Mitchell

[57] ABSTRACT

A system is provided for monitoring a composite signal at the brushes of a generator. The composite signal includes an information signal representative of brush arcing and a recurring noise signal. The system includes a gating network which eliminates the noise signal and passes the information signal therethrough. Timing of the gating network is controlled by a pulse forming network. On the occurrence of a noise signal the pulse forming network produces a disabling signal of predetermined time period exceeding the duration of the noise signal. The gating network blocks all signal passage therethrough for the duration of the disabling signal and thereafter passes signals until the occurrence of the next noise signal. Means is also provided for indicating when the information signal exceeds a predetermined magnitude.

4 Claims, 5 Drawing Figures

SIGNAL MONITORING SYSTEM

BACKGROUND OF THE INVENTION

1. Field of the Invention

This invention relates to a signal processing system for monitoring the arcing potential of generator brushes and more particularly to circuitry for monitoring a generator brush arcing potential which is included in a composite signal further including recurring noise spikes which are in the same frequency band as the brush arcing potential.

2. Description of the Prior Art

U.S. Pat. No. 3,653,019, which was issued to the assignee of the present application on an invention of one of the co-inventors of the present system, discloses a system for monitoring brush arcing potential in a generator where the excitation voltage supplied to the brushes contains high energy noise spikes in the same frequency band as the brush arcing potential. The system disclosed in that patent was designed to enable detection of excessive arcing and prevent damage to brush holder riggings and deterioration of collector slip rings. If action to remedy the excessive arcing is not taken promptly severe damage can occur resulting in considerable downtime for repair of equipment. Use of the signal monitoring system disclosed in that patent not only reduces such downtime, but also provides means to determine when brush condition begins to deteriorate so the equipment may be taken out of service for brush replacement at convenient times. Without a means of detection of such a trend of deterioration sudden failure of equipment might require repair during peak power demand periods when such equipment outage is least desirable.

The signal monitoring system disclosed in U.S. Pat. No. 3,653,019 has proven very effective in performing the function for which it was designed, but it lacks some versatility making it difficult or even impossible to use the system with some generators. In particular, the system does not have the capability of monitoring low potential brush arcing, although low potential, high currents arcing on some generators has been found to be destructive. Also, optimum performance of the system is dependent upon a regularity of recurrence of noise spikes, with increases in the time interval between successive noise spikes causing a decrease in the probability of detecting destructive arcing. This decrease in probability occurs since a gating network employed in the system passes received signals only for a predetermined time period following each noise spike. Therefore, as the time interval between spikes increases the percentage of time that the gating network passes signals decreases and so does the likelihood of detecting destructive arcing.

The present signal monitoring system overcomes these difficulties. It is usable for monitoring of brush arcing in a wide range of generators, from those having very low destructive arcing potentials to those having arcing potentials of the higher amplitudes monitored by the older system. Also, there is substantial certainty of detecting destructive arcing regardless of the existence or lack of noise spikes and regardless of increases in the time interval between successive noise spikes. Such an improvement in the probability of detection occurs since the gating network of the present system passes received signals at all times rather than during a predetermined time period coincident with the actual occurrence of a noise spike. In addition, the present system has fewer components, resulting in improved reliability.

SUMMARY OF THE INVENTION

A system is provided for monitoring a composite signal including an information signal and a recurring noise signal of known duration. The system eliminates the noise signal and actuates an alarm if the information signal exceeds a predetermined magnitude.

In the particular application of the invention disclosed herein the composite signal appears at brushes of a generator where the information signal is in the form of an "RF" information signal generated from a brush arcing and the alarm is actuated when the potential of this RF information signal exceeds a predetermined voltage. The noise signal, if present, is in the form of recurring high energy noise spikes in the same frequency band as the brush arcing signal. Some inherent noise signals are always present in the generators, but lack of such a signal does not prevent proper operation of the system. Additional signals associated with the noise signal may be present in the composite signal.

The system includes a gating network which eliminates the noise signal and associated high frequency components and passes the information signal therethrough. Timing of the gating network is controlled by a pulse forming network. The composite signal is simultaneously applied to a first input of the gating network and to an input of the pulse forming network. On the occurrence of a noise signal the pulse forming network produces a disabling signal of predetermined time period exceeding the duration of the noise signal, which is applied to a second input of the gating network. The gating network blocks all signal passage therethrough for the duration of the disabling signal and thereafter passes the signal received at its first input until the occurrence of the next noise signal. If no noise signal is present in the composite signal the gating network continuously passes all signals received at its first input.

Signals passing through the gating network are applied to a first input of a comparator and compared with a reference signal received at a second input of the comparator. A signal is produced at an output of the comparator when the amplitude of the signal applied to its first input exceeds the amplitude of the reference signal. An alarm connected to the output of the comparator is activated by presence of a signal at the comparator output.

In addition to the basic system elements described above a filter network and a clipping network are provided to precondition the composite signal before application to the gating network and the pulse forming network. The filter removes low frequency signal components and the clipping network limits signal excursions to protect system circuitry. A noise generator is also provided to enable testing of the system for proper operation.

DESCRIPTION OF THE PREFERRED EMBODIMENT

While the invention has broader applications, it is particularly useful for monitoring brush arcing in a dynamoelectric machine such as a generator and the preferred embodiment will be described as used in this particular application.

Figure 1:
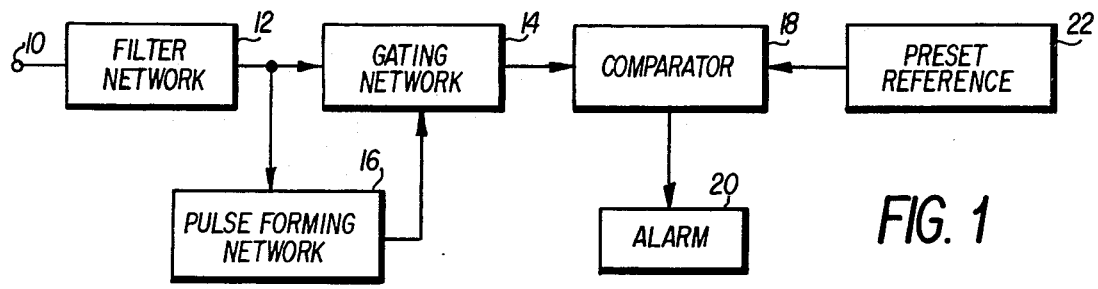
FIG. 1 is a simplified block diagram of the system.
Figure 2A:
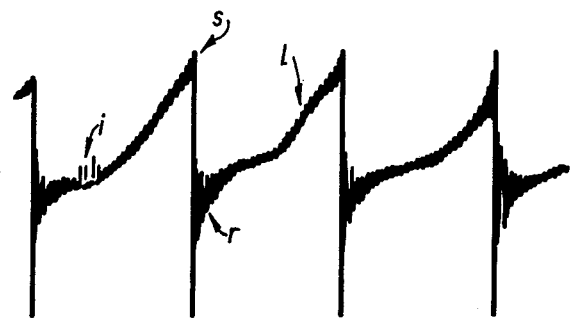
FIGS. 2A and 2B illustrate electrical wave shapes at selected points in the system.
Figure 2B:
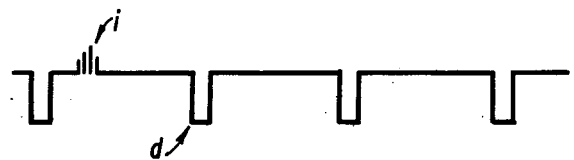

Referring to FIG. 1 a composite signal to be monitored is received at an input 10 of a filter network 12. The composite signal includes an information signal, a recurring noise signal and a low frequency signal. FIG. 2A illustrates such a composite signal monitored at a generator brush. Information relative to brush arcing is contained in the information signal indicated at $i$. The noise signal contains recurring high energy noise spikes $s$ caused, for example, by commutation of solid-state rectifiers supplying excitation voltage to the generator and ringing $r$ associated with each spike. The low frequency signal $l$ contains power frequency ripple transmitted to the brush because of imperfect filtering of a rectified AC supply voltage. The information signal and noise signal are high frequency signals in the same frequency band. The low frequency component is removed in the filter network and the resulting signal is simultaneously applied to a gating network 14 and a pulse forming network 16. The pulse forming network produces a disabling signal of predetermined time period in response to each noise signal received. This time period exceeds the duration of a noise signal. The disabling signal is applied to the gating network to disable the gate and block noise signal passage and allow only the information signal to pass through the gating network. The information signal is then applied to one input of a comparator 18. A reference signal of predetermined magnitude is supplied to a second input of the comparator, from a preset reference 22, in the form of a voltage level. This voltage level is representative of the potential at which brush arcing will begin to cause damage. The output of the comparator activates an alarm 20 if the magnitude of the information signal exceeds that of the reference signal. FIG. 2B illustrates the disabling signal $d$ and the information signal $i$ which is permitted to pass through the gating network.

Figure 3:
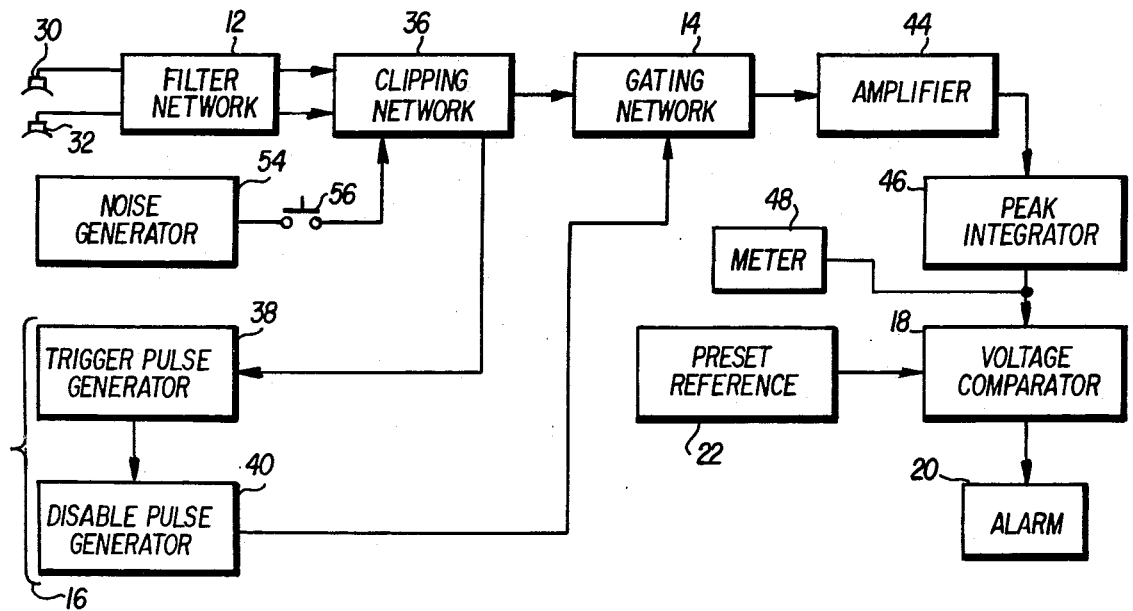
FIG. 3 is a block diagram of a preferred embodiment of the system in accordance with the invention.

Referring to the block diagram of FIG. 3 illustrating the system in more detail, composite signals are monitored at both a positive brush 30 and a negative brush 32 of an electrical generator. Actually, a plurality of positive brushes and of negative brushes may be connected in parallel, but only one of each is illustrated. These composite signals are passed through filter network 12 to remove the undesired low frequency component and applied to a clipping network 36 which limits the positive and negative excursions of the signals in order to protect system circuitry. After clipping, one of the composite signals is applied to a trigger pulse generator 38 which develops a short trigger pulse from the positive going portion of each noise spike. The trigger pulse is then applied to a disable pulse generator 40 which produces a disable pulse of predetermined time period in response to each trigger pulse. The predetermined time period is selected to be of a duration exceeding the known duration of a noise spike and associated ringing. Simultaneous with generation of the trigger pulse and the disable pulse, signal conditioning circuitry removes negative going portions of the filtered and clipped composite signals and instantaneously passes the composite signal of greater magnitude to a first input of gating network. The disable pulses are applied to a second input of the gating network. Application of the disable pulses causes the gating network to block passage of the signal applied to the first input for the known duration of the noise spike and associated ringing. After termination of each disable pulse the gating network is opened to allow passage of the information signal containing the brush arcing signal. The network remains open until the occurrence of the next noise spike which causes generation of the next disable pulse.

The information signal passes through the gating network and is amplified in adjustable gain amplifier 44. The amplified information signal is then applied to a peak integrator 46 which produces a varying DC output signal proportional to brush arcing signal peak amplitude. This DC signal is applied to voltage meter 48 which gives a visual indication of brush arcing potential. The DC signal is also applied to voltage comparator 18 where it is compared with a predetermined reference voltage obtained from preset reference 22. The comparator produces a signal to activate alarm 20 only when the varying DC signal applied to the comparator exceeds the predetermined reference voltage.

In order to test the performance of the system a noise generator 54 is provided. This generator produces a noise in the same frequency band as the brush arcing. Testing is accomplished by disconnecting the system from the brushes and closing switch 56 which couples noise from the generator to the clipping network. Application of such noise will cause the meter to indicate a predetermined voltage if the system is functioning properly.

Figure 4:
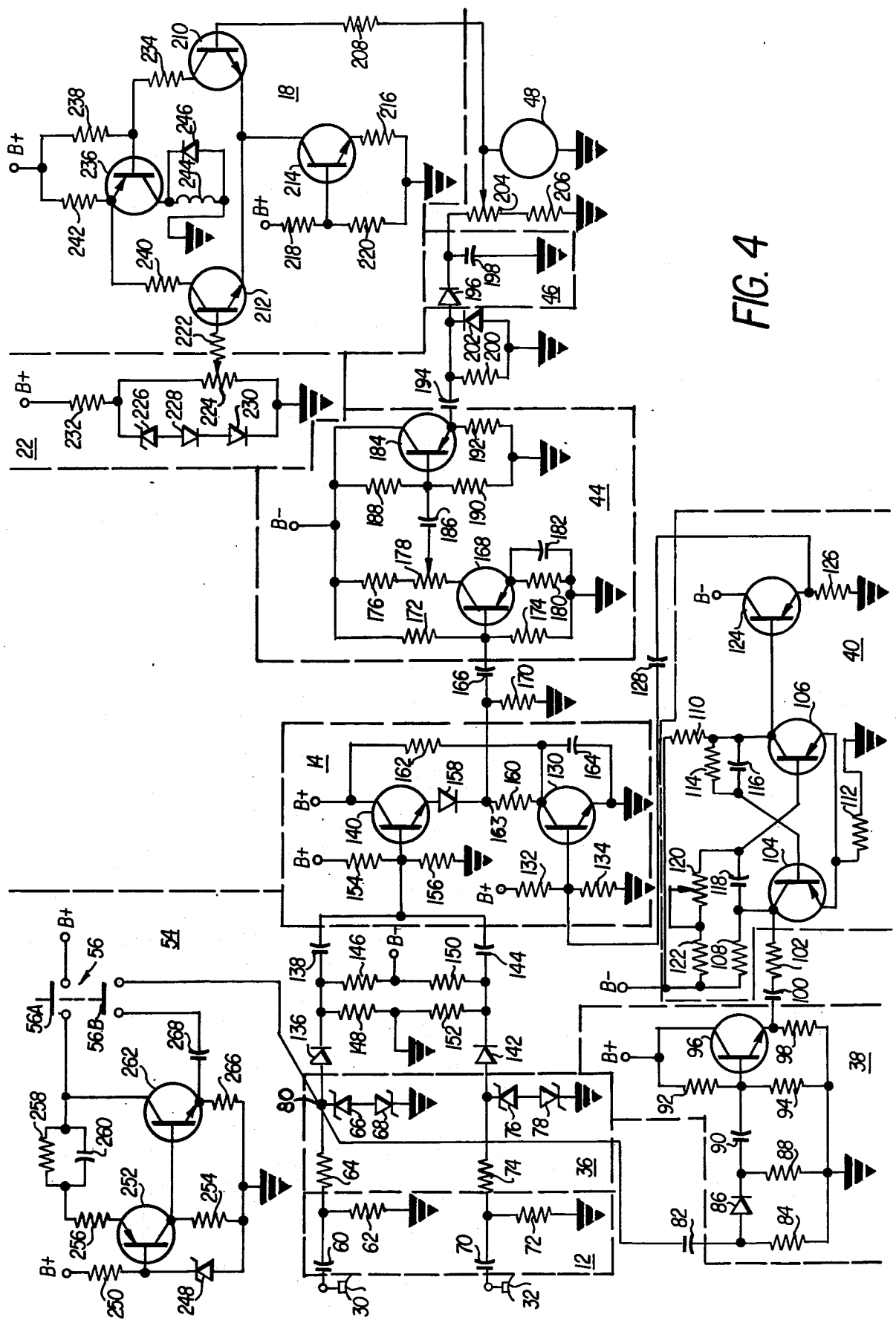
FIG. 4 is a schematic diagram of the embodiment of FIG. 3.

In the schematic diagram of the preferred embodiment illustrated in FIG. 4 all points marked B+ are connected by a common bus line, not shown, to a positive regulated DC voltage supply and all points marked B− are connected by a common bus line, not shown, to a negative regulated DC voltage supply. The composite signal from the positive brush 30 is applied through a high pass filter including capacitor 60 and resistor 62 and through current limiting resistor 64 to a clipping circuit comprising oppositely poled, series connected Zener diodes 66 and 68. Similarly the composite signal from the negative brush 32 is applied through a high pass filter including capacitor 70 and resistor 72 and through current limiting resistor 74 to a clipping circuit comprising oppositely poled, series connected Zener diodes 76 and 78. These two clipping circuits form clipping network 36.

A portion of the filtered and clipped composite signal appearing at point 80 is coupled through capacitor 82 to trigger pulse generator circuitry 38 at a junction of resistor 84 and the anode of diode 86. The opposite end of resistor 84 is connected to ground and the cathode of diode 86 is connected through resistor 88 to ground. Resistor 84 is significantly larger than resistor 88 to encourage propagation of the positive excursion of high energy noise spikes through the diode. Negative excursions are blocked by diode 86 which also serves as a discriminator. Low amplitude signals are shunted to ground through resistors 84 and 88. The positive excursions of the noise spikes are coupled through capacitor 90 to an emitter follower comprising bias resistors 92 and 94, transistor 96 and emitter resistor 98 connected between the B+ bus line and ground. A positive, short duration trigger pulse is developed across resistor 98 of the emitter follower for each noise spike applied to circuitry 38. Each trigger pulse is applied to disable pulse generator 40 through a RC coupling comprising capacitor 100 and resistor 102. Pulse generator 40 comprises a monostable multivibrator and an emitter follower amplifier. The multivibrator includes transistors 104 and 106 having their collectors connected to the B− bus line through resistors 108 and 110 respectively and their emitters connected in common through resistor 112 to ground. The collector of transistor 106 is connected to the base of transistor 104 through a parallel RC network comprising resistor 114 and capacitor 116. The base of transistor 106 is connected to the collector of transistor 104 through capacitor 118. The base of transistor 106 is further connected to the B− bus line through potentiometer 120 and resistor 122. The positive trigger pulse is applied to the collector of transistor 104 and through capacitor 118 to the base of transistor 106. A negative disable pulse of predetermined time period is produced at the collector of transistor 106 in response to each trigger pulse. The duration of the disable pulse is determined by the RC time constant of capacitor 118 in combination with potentiometer 120 and resistor 122.

The disable pulse is coupled through an emitter follower comprising transistor 124 and resistor 126 connected between the B− bus line and ground and through capacitor 128 to an input of gating network 14 at the base of transistor 130. Transistor 130 is normally biased in a low impedance state by resistors 132 and 134 connected between the B+ bus line and ground, but the transistor is switched to a high impedance state whenever a disable pulse is present at the base thereof.

The filtered and clipped composite signal appearing at the cathode of Zener diode 66 is passed through a forward biased diode 136 and through a capacitor 138 to an input of gating network 14 at the base of transistor 140. Similarly the filtered and clipped composite signal appearing at the cathode of Zener diode 76 is passed through a forward biased diode 142 and through a capacitor 144 to the base of transistor 140. Series connected resistor pairs 146, 148 and 150, 152 are connected between the B− bus line and ground. The forward bias on diode 136 is provided by connecting the diode cathode to a junction between resistors 146 and 148. The forward bias on diode 142 is provided by connecting the diode cathode to a junction between resistors 150 and 152. Diodes 136 and 142 block negative signal passage to ensure that the two composite signals do not cancel one another because of instantaneous phase variations. They also serve to ensure that the brush arcing signal of greater instantaneous magnitude is always sensed on the base of transistor 140. If two signals of differing magnitude occur simultaneously, the signal of greater magnitude passes through the diode at which it is received and is coupled through capacitors 138 and 144 to the cathode of the diode receiving the signal of lower magnitude. This effectively reverse biases the diode receiving the lower magnitude signal and prevents signal passage therethrough.

Series connected resistors 154 and 156 are connected between the B+ bus line and ground and a junction between these resistors is connected to the base of transistor 140 to provide forward biasing thereof. This transistor is essentially connected in an emitter follower configuration with diode 158 and transistor 130 connected in series with emitter resistor 160 to complete the return path to ground for the emitter current. Resistor 162 is connected between the collector of transistor 140 and the collector of transistor 130 to form a voltage divider with the collector-emitter impedance of transistor 130. Application of a disable pulse to the base of transistor 130 forces the transistor into a high impedance state and the voltage at the collector increases to a level sufficient to reverse bias diode 158. The magnitude of this voltage is determined by the voltage divider formed with resistor 162. In the absence of a disable pulse, transistor 130 is in a low impedance state and voltage at the collector is sufficiently low to forward bias diode 158. During application of a disable pulse the reverse bias on the diode prevents signal passage from the gating network input at the base of transistor 140 to an output 163 formed at the junction of resistor 160 and the cathode of the diode 158. In the absence of a disable pulse the forward bias on the diode allows signal passage from the input to the output. A bypass capacitor 164 is connected across the collector-emitter of transistor 130 to prevent B+ bus line transients from affecting the bias of diode 158.

Only the information signal applied to the base of transistor 140 is passed to the output, since the disable pulse blocks signal passage during the presence of each noise signal. This information signal containing the brush arcing signal passes through transistor 140, through diode 158 and is coupled from the output 163 through a capacitor 166 to the input of amplifier 44 at the base of a transistor 168. A resistor 170 is connected between output 163 and ground for the purpose of providing a moderate impedance to ground from the cathode of diode 158 when transistor 130 is in the process of switching.

Transistor 168 is connected in a conventional common emitter amplifier circuit including bias resistors 172, 174, 176, potentiometer 178 and resistor 180. A bypass capacitor 182 is connected across resistor 180. The amplified brush arcing signal appearing at the potentiometer wiper is coupled to the base of transistor 184 through capacitor 186. The gain of the amplifier 44 is adjusted by changing the position of the potentiometer wiper which alters amplifier load resistance. Transistor 184 forms part of an emitter follower connected between the B− bus line and ground and including bias resistors 188 and 190 and emitter resistor 192. The emitter follower is included in amplifier 44 to prevent loading of the collector circuit of transistor 168.

The amplified signal appears at the emitter of transistor 184 and is coupled through blocking capacitor 194 to the peak integrator 46 comprising diode 196 and capacitor 198. The peak integrator functions similarly to a filtered half wave rectifier producing a varying DC output signal representative of the potential brush arcing signal. A resistor 200 and a diode 202 are connected in parallel between the anode of diode 196 and ground to provide a slight forward bias for diode 196. This forward bias is developed from noise inherent in regulated power supplies. This noise is coupled to the integrator through blocking capacitor 194. The positive bias voltage is developed across resistor 200 which provides an impedance path to ground for the noise. Diode 202 shunts negative noise excursions to ground. The output of the peak integrator is connected to one end of a series combination of potentiometer 204 and resistor 206 with the opposite end of the combination connected to ground.

The integrator output signal appears at the wiper of potentiometer 204. This signal is applied to voltage meter 48, referenced to ground, and through resistor 208 to the base of transistor 210 which is connected with transistor 212 in a differential amplifier configuration. The emitter-collector circuit of transistor 214 and emitter resistor 216 are connected in series with the parallel connected emitter-collector circuits of both transistors 210 and 212 to produce a constant current in the differential amplifier. Constant bias is applied to transistor 214 by connection of the transistor base to a junction between resistors 218 and 220 which are connected in series between the B+ bus line and ground.

The base of transistor 212 is connected to a preset adjustable reference 22 through resistor 222 and the wiper arm of potentiometer 224 which is in turn connected in parallel with the series combination of Zener diode 226 and forward biased diodes 228 and 230. One end of the series combination of diodes is connected through resistor 232 to the B+ bus line and the opposite end is connected to ground. The preset reference 22 provides a preset adjustable reference voltage to one input of comparator 18 at the base of transistor 212 for comparison with the signal received from the peak integrator at the other input of the comparator. The collector of transistor 210 is connected through resistor 234 to the base of transistor 236 which in turn is connected to the B+ bus line through bias resistor 238. The collector of transistor 212 connected through resistor 240 to the emitter of transistor 236 which in turn is connected to the B+ bus line through bias resistor 242. A relay coil 244 having relay contacts (not shown) which are used to actuate an alarm or deenergize the generator monitored, upon coil energization, is connected between the collector of transistor 236 and ground. A protective diode 246 is connected in parallel with the coil to prevent negative spikes produced in the coil from damaging transistor 236.

A noise generator 54 is provided for testing the system. Noise is generated by a Zener diode 248 biased near the knee of its characteristic curve. The anode of the diode is connected to ground and the cathode is connected to the B+ bus line through register 250. The cathode of the diode is also connected to the base of transistor 252 which in turn is connected in a common emitter amplifier configuration. The collector of transistor 252 is connected to ground through a resistor 254. The emitter of transistor 252 is connected to a resistor 256 which in turn is connected to one end of a parallel combination including resistor 258 and capacitor 260. The opposite end of the parallel combination is connected to the collector of a transistor 262 and also to a contact of switch section 56A of normally open switch 56. The remaining contact of switch section 56A is connected to the B+ bus line. Transistor 262 is connected in an emitter follower configuration including emitter resistor 266. The amplified noise signal appearing at the collector of transistor 252 is applied to the base of transistor 262 and then coupled from the emitter of this transistor through blocking capacitor 268 to a contact of switch section 56B. The remaining contact of switch section 56B is connected to point 80 of the clipping network.

OPERATION

The high pass filter including capacitor 60 and resistor 62 passes only high frequency components of the composite signal from positive brush 30. Similarly, the high pass filter including capacitor 70 and resistor 72 passes only high frequency components of the composite signal from negative brush 32. Positive and negative excursions of each of these signals is then limited by the Zener diode clipping circuits including diodes 66 and 68 for the signal from the positive brush and diodes 76 and 78 for the signal from the negative brush. Excursions of these signals are limited to protect monitor system circuitry.

A portion of the filtered and clipped composite signal appearing at point 80 is coupled through capacitor 82 to trigger pulse generator 38. This generator serves to isolate the input of disable pulse generator 40 from clipping circuitry connected to point 80 and to derive from each noise spike and associated ringing a single pulse for triggering the monostable multivibrator. The monostable multivibrator produces a single, substantially rectangular disable pulse, as shown at $d$ in FIG. 2B in response to each trigger pulse and the width of this disable pulse is determined by the RC time constant of resistor 122, potentiometer 120 and capacitor 118. The potentiometer is adjusted to provide a disable pulse of predetermined time period which period slightly exceeds the duration of a noise spike and associated ringing. The emitter follower including transistor 124 couples the disable pulse through capacitor 128 to the gating network input at the base of transistor 130.

Simultaneously with development of the disable pulse, the filtered and clipped composite signal having the greater instantaneous magnitude is passed through one of forward biased diodes 136 and 142 and is applied to the gating network input at the base of transistor 140.

Gating network 14 eliminates each noise spike and associated ringing from the signal applied to the base of transistor 140, since the network blocks signal passage therethrough during the presence of each disable pulse, which occurs simultaneously with each noise spike as illustrated in FIG. 2. Only the information signal including the brush arcing signal passes through the gating network and appears at output 163. This brush arcing signal is amplified in adjustable gain amplifier 44 and then applied to peak integrator 46. The gain of amplifier 44 is adjusted at potentiometer 178 to provide adequate amplification to enable measurement of brush arcing potential for the particular generator monitored. The amplification required is dependent upon the level of the arcing potential to be measured which in turn is a function of the generator with which the monitoring system is utilized.

The amplified information signal is coupled from the emitter of transistor 184 through DC blocking capacitor 194 to the peak integrator 46. The forward bias of diode 196 is provided so that a voltage level offset from ground potential appears at the output of the integrator even in the absence of brush noise resulting in a slight offset from a zero reading of meter 48. The purpose of this offset is to give some indication that system circuitry is in operation. The amount of offset can be adjusted at potentiometer 204.

The varying DC output signal measured by voltage meter 48 is a measure of brush arcing potential. This signal is applied to the base of transistor 210 which operates as one input of the voltage comparator 18. The present adjustable reference voltage is applied to the base of transistor 212 which operates as a second input of the voltage comparator. The reference voltage is preset to a predetermined level representative of the potential at which brush arcing is considered destructive for the particular generator monitored. If the signal applied to the other comparator input exceeds the reference voltage an output signal is developed across the base-emitter circuit of transistor 236. This output signal causes the transistor to conduct causing energization of relay coil 244 and activation of an alarm through the relay contacts.

It will be appreciated from the above description that the system is useable with a wide range of generators having differing arcing potentials and can be easily tailored for use with a particular generator by adjustment of potentiometers provided in the system. The system is designed for use with generators having recurring high energy noise spikes, but requires no modification for use with generators without such spikes since the gating network passes signals in the absence of such spikes. The disable pulse occurs only during a predetermined time period as each noise spike occurs and the gating network will pass the information signal until the next occurrence of a noise spike, regardless of the time period between successive noise spikes. The system is therefore useable with generators having noise spikes which recur at varying intervals, since disable pulse generation automatically follows variations in the time period between noise spikes. Also, the statistical probability of detection of brush arcing is maximized since passage of signals through the gating network is only blocked on the occurrence of the high energy noise spikes.

Although a specific embodiment of a system for monitoring generator brush arcing has been described, it is not intended that the invention be limited to this embodiment. Rather, it is intended that the invention include variations obvious to those skilled in the art which fall within the scope of the appended claims.

What is claimed is:

1. A generator brush monitor adapted to provide a signal upon the occurrence of generator brush arcing voltages exceeding a predetermined value and comprising:
    a. means receiving a voltage signal including high frequency information signals representative of generator brush arcing and low frequency signals representative of the generator voltage and various harmonics thereof as well as possible recurrent high frequency noise spikes in the same frequency band as said information signals;
    b. filter means for filtering said low frequency signals from said received voltage signal;
    c. clipping means for removing excess positive-going and negative-going peaks of said information signals;
    d. means for adjusting the level of said information signals to which said monitor is responsive;
    e. gating means receiving the filtered and clipped information signals and adapted to pass said information signals unless said gating means is in receipt of a disabling signal, but only for substantially the duration of said disabling signal and its ringing;
    f. means responsive to the output of said gating means to amplify and integrate said gated signal;
    g. means responsive to said amplified and gated information signal for comparing the same with an adjustable reference voltage for producing an alarm signal when said information signal exceeds the adjusted value of said reference voltage;
    h. means coupled to said clipping means for providing a disable pulse and to maintain the same substantially so long as a noise signal and its ringing is present in said input voltage signal and to supply said disable pulse to said gating means;
    i. said gating means being further adapted to gate said information signal so long as said disable pulse is input thereto but only substantially for such period so that said monitor is operative to receive and act in response to said information signals except when it is in receipt of a noise signal in the same frequency band as said information signals.

2. The apparatus of claim 1 wherein said means for producing a disable pulse comprises:
    a. a trigger pulse generator for producing a trigger pulse in response to the noise signal, said trigger pulse generator having an input at which the composite signal is received and an output to which the trigger pulse is delivered,
    b. a disable pulse generator for producing a disable pulse of said predetermined time period in response to the trigger pulse, said disable pulse generator having an input at which the trigger pulse is received and an output to which the disable pulse is delivered, said disable pulse providing the disabling signal to said gating means.

3. A system as recited in claim 2 wherein the disable pulse generator is a monostable multivibrator.

4. The apparatus recited in claim 1 wherein the gating network comprises:
    a. first and second transistors connected in series, with the collector of the first transistor and the emitter of the second transistor connected to voltage sources of differing potential, said first transistor base functioning as the first gating network input and said second transistor base functioning as the second gating network input;
    b. bias circuitry connected to the base of the second transistor to effect biasing of the transistor into a low impedance state in the absence of a disabling signal and biasing into a high impedance state in the presence of a disabling signal;
    c. a diode and a resistor connected in series between the transistors, said diode being connected to the emitter of the first transistor and said resistor being connected to the collector of the second transistor;
    d. a resistor connected between the first transistor collector and the second transistor collector, said resistor forming a voltage divider with the second transistor, said voltage divider effecting reverse biasing of the diode when the second transistor is in a high impedance state and effecting forward biasing of the diode when the second transistor is in a low impedance state; and
    e. an output formed at a junction point between the diode and the resistor, said diode blocking signal passage between the first input and the output when reverse biased and permitting signal passage between the first input and the output when forward biased.

* * * * *